(12) United States Patent
Hsu (10) Patent No.: US 8,727,215 B2
(45) Date of Patent: May 20, 2014

(54) TEST DEVICE FOR MAGNETIC STRIPE DECODER CHIP

(71) Applicant: Uniform Industrial Corp., New Taipei (TW)

(72) Inventor: Tung-Jung Hsu, New Taipei (TW)

(73) Assignee: Uniform Industrial Corp., New Taipei (TW)

( * ) Notice: Subject to any disclaimer, the term of this patent is extended or adjusted under 35 U.S.C. 154(b) by 0 days.

(21) Appl. No.: 13/684,368

(22) Filed: Nov. 23, 2012

(65) Prior Publication Data

US 2013/0240625 A1 Sep. 19, 2013

(30) Foreign Application Priority Data

Mar. 14, 2012 (TW) ............................. 101204634 U (51) Int. Cl.
*G06K 7/00* (2006.01)
*G06K 7/08* (2006.01)
*G06K 19/00* (2006.01)
*G06K 19/06* (2006.01)

(52) U.S. Cl.
USPC ........... 235/438; 235/487; 235/492; 235/493; 235/439; 235/449

(58) Field of Classification Search
USPC .................. 235/438, 439, 487, 492, 493, 449
See application file for complete search history.

(56) References Cited

U.S. PATENT DOCUMENTS

| | | | | |
|---|---|---|---|---|
| 3,795,805 A * | 3/1974 | Swanberg et al. | ............ | 250/226 |
| 3,873,813 A * | 3/1975 | Lahr et al. | ...................... | 235/380 |
| 4,527,051 A * | 7/1985 | Stenzel | ......................... | 235/380 |
| 4,841,389 A * | 6/1989 | Hoyt et al. | ...................... | 360/75 |
| 4,926,031 A * | 5/1990 | Stenzel | ......................... | 235/380 |
| 5,162,728 A * | 11/1992 | Huppenthal | ............ | 324/756.03 |
| 5,679,942 A * | 10/1997 | Toyama | ........................ | 235/449 |
| 5,818,915 A * | 10/1998 | Hayes et al. | .................. | 455/405 |
| 6,240,515 B1 * | 5/2001 | Carnegie et al. | ............. | 713/182 |
| 6,719,199 B1 * | 4/2004 | Cotten et al. | .................. | 235/380 |
| 7,866,556 B2 * | 1/2011 | Pedigo et al. | ................. | 235/449 |
| 8,584,956 B2 * | 11/2013 | Wilson et al. | ................. | 235/492 |
| 2001/0011944 A1 * | 8/2001 | Garrido-Gadea et al. | ... | 340/5.86 |
| 2005/0006468 A1 * | 1/2005 | Fandel et al. | ................. | 235/383 |
| 2005/0080649 A1 * | 4/2005 | Alvarez et al. | ..................... | 705/1 |
| 2005/0274801 A1 * | 12/2005 | Harding et al. | .............. | 235/438 |
| 2007/0080205 A1 * | 4/2007 | You et al. | ....................... | 235/375 |
| 2008/0029597 A1 * | 2/2008 | Harding et al. | ............... | 235/437 |
| 2008/0110987 A1 * | 5/2008 | Cato et al. | ...................... | 235/437 |

(Continued)

*Primary Examiner* — Daniel Walsh
(74) *Attorney, Agent, or Firm* — Muncy, Geissler, Olds & Lowe, P.C.

(57) ABSTRACT

A test device for a magnetic stripe decoder chip includes a signal generator, a chip slot, a signal conversion circuit and a control unit. The signal generator sequentially outputs a plurality of test waveform signals. The signal conversion circuit includes at least one transformer, the transformer is used for converting the test waveform signals into a plurality of false track signals, and correspondingly outputting the false track signals to one of track signal receiving ends of the magnetic stripe decoder chip. The control unit receives at least one decoding string generated respectively by decoding the false track signals through the magnetic stripe decoder chip, and compares the at least one decoding string with a test string represented by the basic track signal, thereby determining a decoding function of the magnetic stripe decoder chip.

9 Claims, 7 Drawing Sheets

(56) References Cited

U.S. PATENT DOCUMENTS

| | | | |
|---|---|---|---|
| 2008/0174315 A1* | 7/2008 | Top et al. | 324/457 |
| 2008/0244143 A1* | 10/2008 | Chiou et al. | 710/302 |
| 2009/0078764 A1* | 3/2009 | Pedigo et al. | 235/449 |
| 2010/0065637 A1* | 3/2010 | Top et al. | 235/438 |
| 2010/0230494 A1* | 9/2010 | Okui | 235/449 |
| 2010/0293382 A1* | 11/2010 | Hammad | 713/173 |
| 2013/0122825 A1* | 5/2013 | Deforge et al. | 455/73 |
| 2013/0126613 A1* | 5/2013 | Hsu | 235/438 |

\* cited by examiner

TEST DEVICE FOR MAGNETIC STRIPE DECODER CHIP

CROSS-REFERENCES TO RELATED APPLICATIONS

This non-provisional application claims priority under 35 U.S.C. §119(a) on Patent Application No. 101204634 filed in Taiwan, R.O.C. on 2012 Mar. 14, the entire contents of which are hereby incorporated by reference.

BACKGROUND

1. Technical Field

The disclosure relates to a test device of a chip, and more particularly, to a test device for a magnetic stripe decoder chip.

2. Related Art

Figure 1:
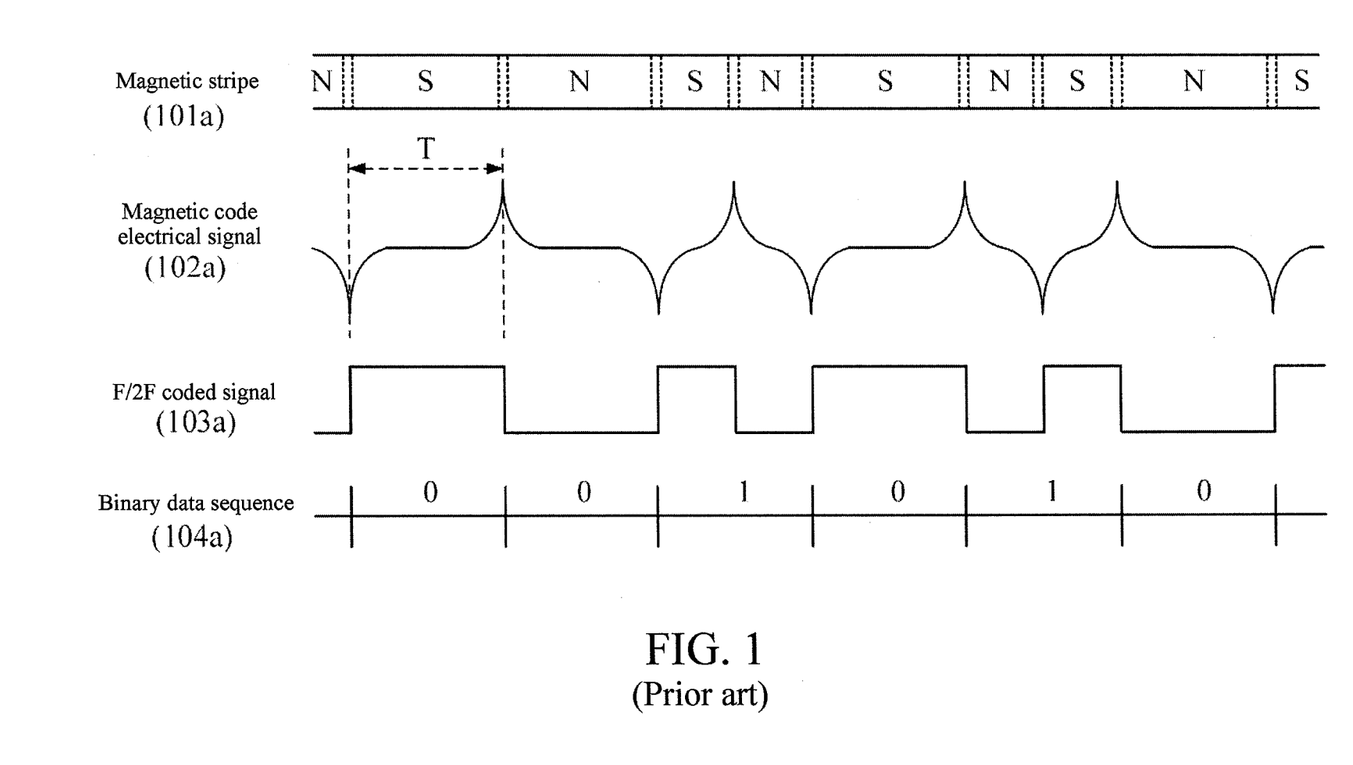
FIG. 1 is a relation diagram of a magnetic stripe and a decoding signal in the prior art.

FIG. 1 is a relation diagram of a magnetic stripe and a decoding signal in the prior art. Generally, for a magnetic stripe 101a on a financial card or a credit card, specifically coded binary data is corresponding to a sorting and distribution situation of magnetic poles on the magnetic stripe. The magnetic stripe may record information using coding techniques such as a frequency modulation (FM) technique, a phase modulation (PM) technique, and a dual-frequency coherent phase (F/2F, or Aiken Biphase), technique. The drawing shows an example of distribution of magnetic poles coded by using the dual-frequency coherent phase coding technique (F/2F, or Aiken Biphase). A magnetic code electrical signal 102a is generated by sensing the distribution of the magnetic poles on the magnetic stripe 101a (including a plurality of magnetic north poles N and a plurality of magnetic south poles S).

As shown in FIG. 1, an F/2F coded signal 103a is a clock signal with high and low levels staggered, and is defined to 0 or 1 through duration of the high level or the low level. Consequently, the F/2F coded signal 103a may be decoded into a binary data sequence 104a according to various peak-to-peak periods T of the magnetic code electrical signal 102a.

Figure 2:
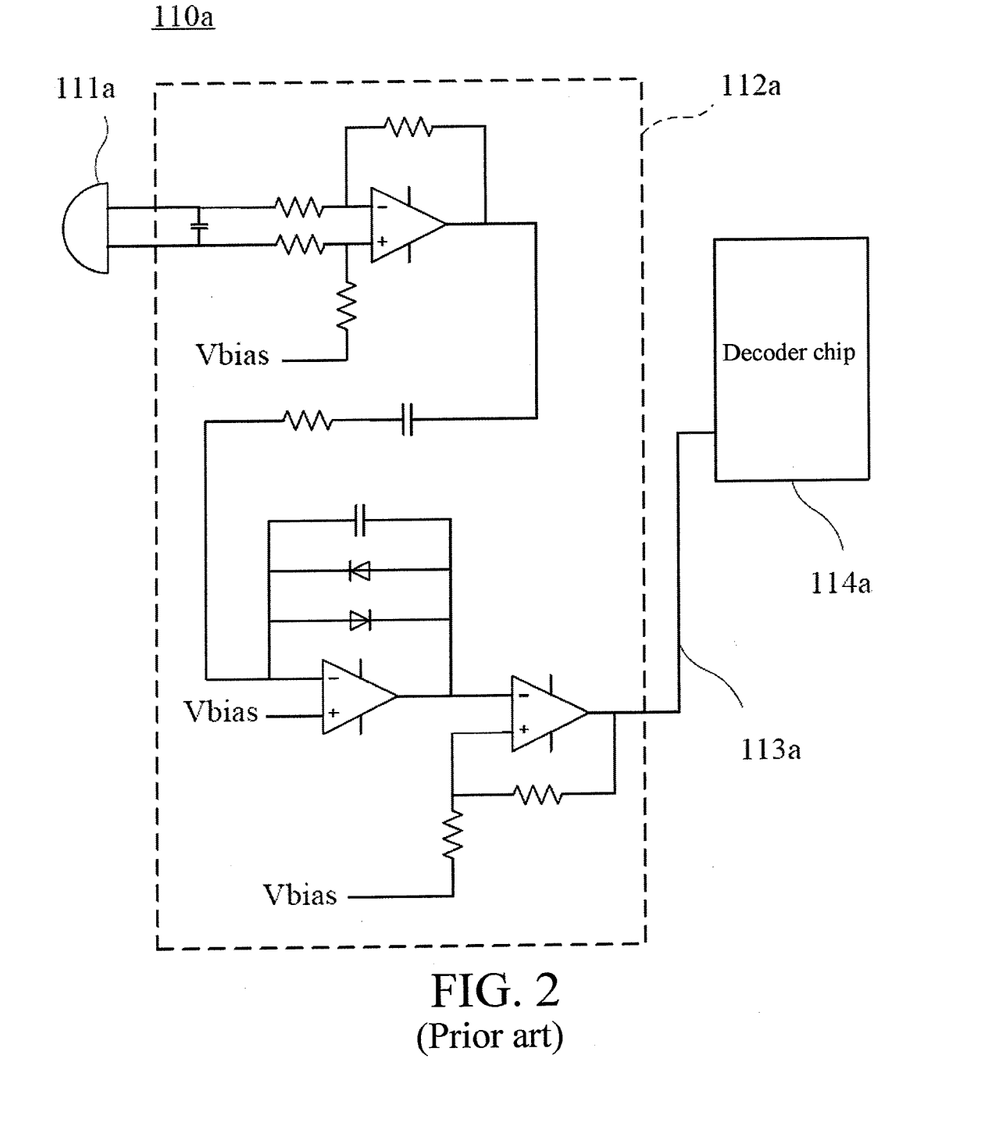
FIG. 2 is a schematic diagram of a magnetic stripe reading circuit 110a of the prior art.

FIG. 2 is a schematic diagram of a magnetic stripe reading circuit 110a of the prior art. As shown in FIG. 2, a magnetic head 111a may sense movement of a magnetic stripe on a magnetic card, so as to generate the magnetic code electrical signal 102a shown in FIG. 1. A signal processing circuit 112a converts the magnetic code electrical signal 102a into an F/2F coded signal 113a. A decoder chip 114a receives the F/2F coded signal 113a, and performs decoding to obtain the binary data sequence 104a shown in FIG. 1.

As shown in FIG. 2, a front end of the signal processing circuit 112a is a differential amplifier, for receiving a differential signal (the magnetic code electrical signal 102a), output by the magnetic head 111a, and amplifying the signal, so that a comparator at a rear end detects a waveform to extract peaks by using a level voltage Vbias as a reference, thereby converting the peaks into the F/2F coded signal 113a.

However, a manufacturer of the decoder chip 114a must detect the quality of the decoder chip 114a before delivery. In a current test manner, architecture of the magnetic stripe reading circuit 110a is adopted as a test circuit, and the decoder chip 114a is tested by swiping the card manually, so as to determine whether the decoder chip 114a can read information recorded by the magnetic stripe correctly.

However, the test method has the following problems:

1. In order to test the reliability of the decoder chip 114a, the same decoder chip 114a should be tested repeatedly using different swiping rates and different swiping directions, which is not only time consuming, but also has a low test speed.

2. Manually controlled swiping cannot maintain an accurate swiping rate; consequently, test conditions are inconsistent with actual operation, and test results are incomplete.

SUMMARY

In view of the above problems, the disclosure is directed to provide a test device for a magnetic stripe decoder chip, so as to solve the problem in the prior art that testing is performed through manually swiping cards.

In an embodiment of the disclosure, a test device for a magnetic stripe decoder chip is provided. The magnetic stripe decoder chip includes at least one track signal receiving end. The test device includes a signal generator, a chip slot, a signal conversion circuit and a control unit.

The signal conversion circuit is connected electrically between the signal generator and the chip slot. The control unit is connected electrically to the chip slot.

The signal generator sequentially outputs a plurality of test waveform signals, and the test waveform signals may be formed by amplifying or reducing a period of a basic track signal in different magnifications. The chip slot is used for the magnetic stripe decoder chip to insert. The signal conversion circuit includes at least one transformer, a primary side of the transformer is connected electrically to the signal generator, and a secondary side of the transformer is connected electrically to the chip slot. The transformer is used for converting the test waveform signals into a plurality of false track signals, so as to correspondingly output the false track signals to one of the track signal receiving ends of the magnetic stripe decoder chip.

The control unit receives at least one decoding string generated respectively by decoding the false track signals through the magnetic stripe decoder chip, and compares the at least one decoding string with a test string represented by the basic track signal, thereby determining a decoding function of the magnetic stripe decoder chip.

The test device for the magnetic stripe decoder chip according to the disclosure may reliably test the magnetic stripe decoder chip in various specific swiping rates, and may avoid manual swiping actions, thereby reducing the test time. Additionally, by adjusting the amplitude variation of the test waveform signal, tolerance of the magnetic stripe decoder chip on external interference (for example, signal drift), may be tested. Furthermore, through the test waveform signal including amplitude jitter, tolerance of the magnetic stripe decoder chip on noise interference may be tested.

BRIEF DESCRIPTION OF THE DRAWINGS

The disclosure will become more fully understood from the detailed description given herein below for illustration only, and thus not limitative of the disclosure, wherein.

DETAILED DESCRIPTION

Figure 3:
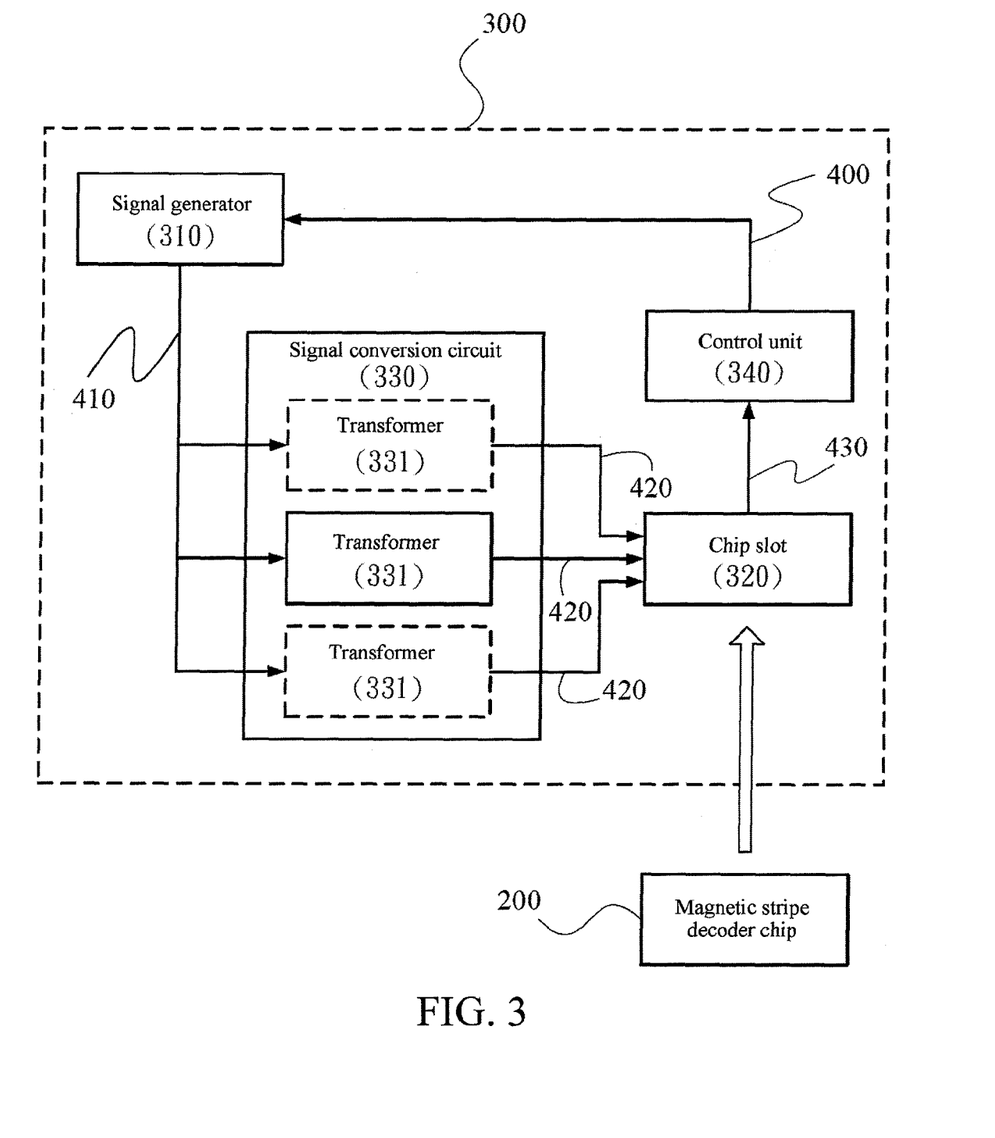
FIG. 3 is a schematic block diagram of a test device for a magnetic stripe decoder chip according to an embodiment.

FIG. 3 is a schematic block diagram of a test device 300 for a magnetic stripe decoder chip 200 according to an embodiment.

Please refer to FIG. 3, in which the test device 300 for the magnetic stripe decoder chip 200 includes: a signal generator 310, a chip slot 320, a signal conversion circuit 330 and a control unit 340. The magnetic stripe decoder chip 200 includes at least one track signal receiving end (not shown), so as to receive a signal corresponding to a track.

The signal conversion circuit 330 is connected electrically between the signal generator 310 and the chip slot 320. The control unit 340 is connected electrically to the chip slot 320.

Figure 4:
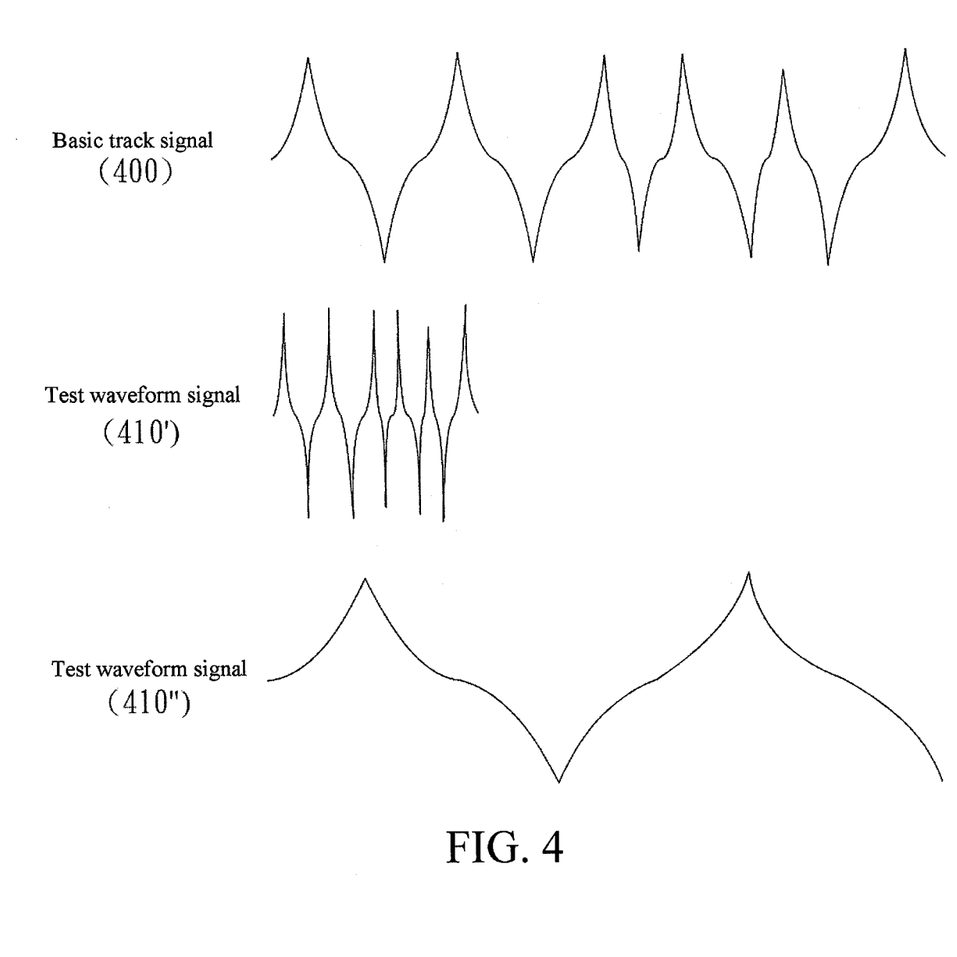
FIG. 4 is a schematic diagram of a basic track signal and test waveform signals according to an embodiment.

The signal generator 310 sequentially outputs a plurality of test waveform signals 410 (including, but not limited to, signals shown in Table 1). The test waveform signals 410 are formed by amplifying or reducing a period of a basic track signal 400 in different magnifications (as shown in FIG. 4). The chip slot 320 is used for the magnetic stripe decoder chip 200 to insert. The signal conversion circuit 330 includes at least one transformer 331. A primary side of the transformer 331 is connected electrically to the signal generator 310, and a secondary side of the transformer 331 is connected electrically to the chip slot 320. The transformer 310 converts the test waveform signals 410 into a plurality of false track signals 420, so as to correspondingly output the false track signals 420 to one of the track signal receiving ends of the magnetic stripe decoder chip 200. The control unit receives at least one decoding string 430 respectively generated by decoding the false track signals 420 through the magnetic stripe decoder chip 200, and compares the at least one decoding string 430 with a test string represented by the basic track signal 400, thereby determining a decoding function of the magnetic stripe decoder chip 200.

TABLE 1

Parameter setting specification of a plurality of test waveform signals 410

| | Test waveform signal | Purpose of test |
|---|---|---|
| 1 | 5 IPS, 3 V | Test TK1, TK3 (60%~150% amplitude, 5 IPS) |
| | | Test TK2 (60~150% amplitude, 15 IPS) |
| 2 | 1.5 IPS, 3 V | Test TK2 (60%~150% amplitude, 4.5 IPS) |
| 3 | 5 IPS, 3 V | Test TK1, TK3 (30%~150% amplitude, 5 IPS) |
| | | Test TK2 (30~150% amplitude, 15 IPS) |
| 4 | 1.5 IPS, 3 V | Test TK2 (30%~150% amplitude, 4.5 IPS) |
| 5 | 20 IPS, 3 V | Test TK1, TK3 (60%~150% amplitude, 60 IPS) |
| | | Test TK2 (60~150% amplitude, 20 IPS) |
| 6 | 55 IPS, 3 V | Test TK1, TK3 (60%~150% amplitude, 55 IPS) |
| 7 | 20 IPS, 5 V | All 0, Test memories of TK1, TK2, TK3, and test working function of 5 V |
| 8 | 20 IPS, 5 V | All 1, Test memories of TK1, TK2, TK3, and test working function of 5 V |

In some embodiments, the control unit 340 is connected electrically to the signal generator 310, so as to transmit the basic track signal 400 to the signal generator 310 in advance. In some embodiments, the basic track signal 400 is stored in the signal generator 310 in advance.

Please refer to FIG. 4, in which a schematic diagram of a basic track signal 400 and test waveform signals 410', 410" according to an embodiment is shown. As shown in FIG. 4, the basic track signal 400 may be a signal read by the magnetic head from a magnetic stripe simulated according to F/2F coding technique. The waveform shown in FIG. 4 only shows a part of the basic track signal 400 and the test waveform signals 410', 410", and the embodiments are not limited thereto.

Please refer to FIG. 4 and Table 1 together, in which a plurality of test waveform signals 410 are respectively used for testing situations having different swiping rates (IPS, inches per second), and different magnetic record densities, so the test waveform signals 410 may have different periods. That is to say, the same basic track signal 400 (for example, of 5 IPS), may be scaled along a timeline, so as to form the test waveform signal 410' of 20 IPS and the test waveform signal 410" of 1.5 IPS with respect to the same magnetic record density. The scaling of a signal along the timeline is well-known by persons skilled in the art, and is not repeated here.

In some embodiments, the signal generator 310 may vary, with a gain range, the amplitude of at least a part of each test waveform signal 410. As shown in Table 1, by taking a three-track magnetic stripe as an example, the test waveform signal 410 of a number 1 may be used to simulate reading signals generated by a first track TK1 and a third track TK3 in a swiping rate of 5 IPS, and may be used to simulate reading a signal generated by a second track TK2 in a swiping rate of 15 IPS. Additionally, the test waveform signal 410 of the number 1 is formed by varying the amplitude of the basic track signal 400 in a gain range of 60% to 150%. Here, the magnitude of the amplitude variation may be adjusted according to the decoding capability of the magnetic stripe decoder chip 200 to be tested. For example, if a magnetic stripe decoder chip 200 having better decoding capability is to be tested, the gain range may be adjusted to 30% to 150%. Consequently, the magnetic stripe decoder chip 200 may further be classified by grade.

As shown in Table 1, the test waveform signals 410 of a number 7 are signals with F/2F codes all being 1, and the test waveform signals 410 of a number 8 are signals with F/2F codes all being 0. Consequently, the magnetic stripe decoder chip 200 for test corresponds to memory blocks (such as memories or buffer), of the three tracks TK1, TK2, and TK3.

Figure 5:
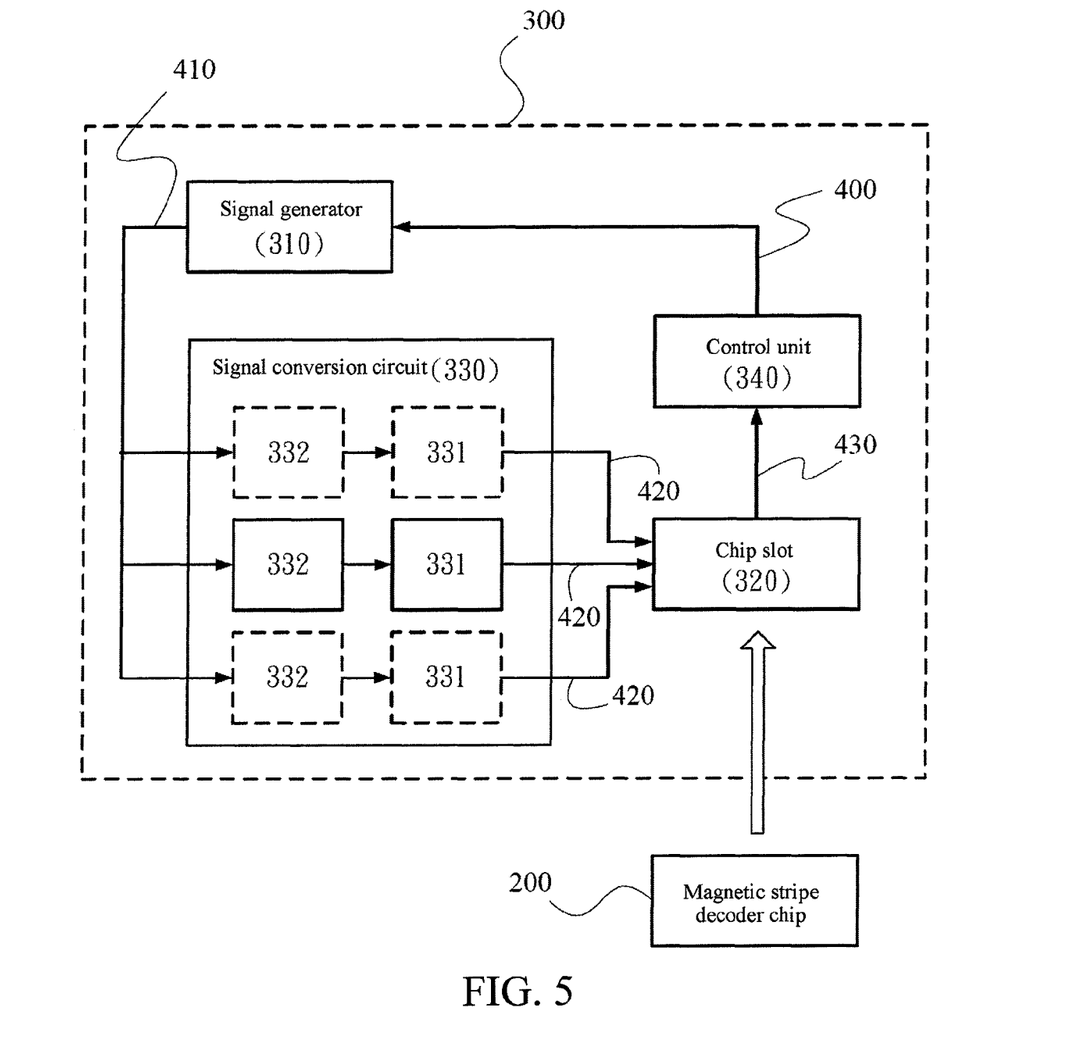
FIG. 5 is a schematic block diagram of a test device for a magnetic stripe decoder chip according to another embodiment.

FIG. 5 is a schematic block diagram of a test device 300 for a magnetic stripe decoder chip 200 according to another embodiment.

Please refer to FIG. 5, in which as compared with FIG. 3, the signal conversion circuit 330 may further include a signal attenuator 332. The signal attenuator 332 is connected electrically between the signal generator 310 and the transformer 331, and attenuates the test waveform signals 410 to be conforming to input voltage ranges of the track signal receiving ends. For example, if the input voltage range of the track signal receiving end of the magnetic stripe decoder chip 200 is 2 mV (millivolts), to 160 mV, the test waveform signal 410 having the maximum voltage being 3 V (volts) or 5 V may be attenuated to a range of 2 mV to 160 mV. Here, the signal attenuator 332 may be implemented by an amplifier circuit having the gain less than 1.

Figure 6:
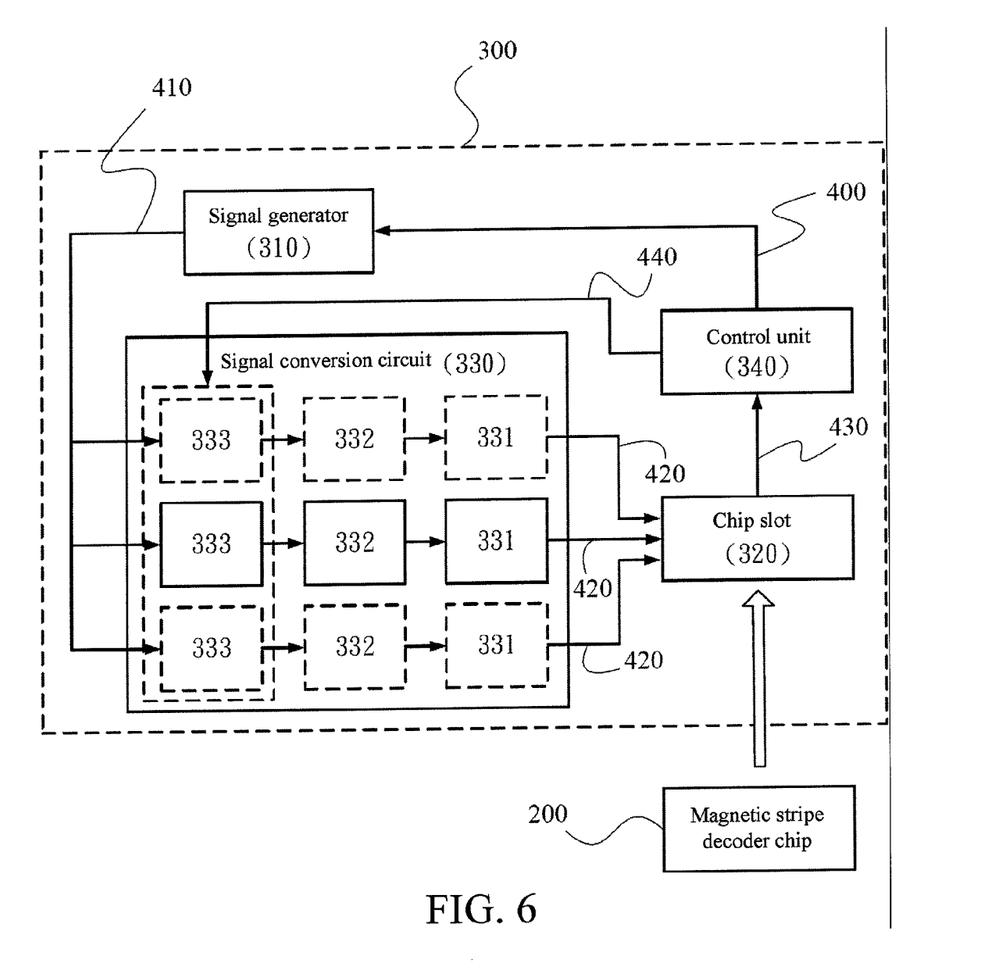
FIG. 6 is a schematic block diagram of a test device for a magnetic stripe decoder chip according to still another embodiment.

FIG. 6 is a schematic block diagram of a test device 300 for a magnetic stripe decoder chip 200 according to still another embodiment.

Please refer to FIG. 6, in which as compared with FIG. 5, the signal conversion circuit 330 may further include at least one adjustable amplifier 333. Each adjustable amplifier 333 is connected electrically between the signal generator 310 and a primary side of the corresponding transformer 331, and is used for receiving the test waveform signal 410, and adjusting the gain of the adjustable amplifier 333 according to an amplification control signal 440 output by the control unit 340. That is to way, the test waveform signal 410 shown in Table 1 may not vary the amplitude thereof, but the amplitude of the test waveform signal 410 is varied by the adjustable amplifier 333.

The adjustable amplifier 333 may be implemented through an operational amplifier, and by switching, through a switch, between resistors having different resistance that are connected to the operational amplifier, the gain of the adjustable amplifier 333 may be changed. That is to say, the adjustable amplifier 333 may include an operational amplifier, a switching circuit and a plurality of resistors that are connected in sequence. The amplification control signal 440 controls the switching circuit, so that the operational amplifier is connected to the resistors having different resistance, so as to change the gain of the adjustable amplifier 333.

In some embodiments, the adjustable amplifier 333 and the signal attenuator 332 may be connected between the signal generator 310 and the transformer at the same time. Additionally, the connecting sequence of the adjustable amplifier 333 and the signal attenuator 332 is not limited to FIG. 6, and the signal generator 310 may be first connected to the signal attenuator 332 and then connected to the adjustable amplifier 333.

In some embodiments, the adjustable amplifier 333 may change the gain of the test waveform signal 410 over time according to the change of the amplification control signal 440. That is to say, the amplification control signal 440 may change over time to change the switching circuit at different time points, so that the operational amplifier is connected to the resistors having different resistance, so as to change the gain of the adjustable amplifier 333.

In some embodiments, the gain range of the adjustable amplifier 333 may be 30% to 150%.

In some embodiments, for the same test waveform signal 410, the gain of the adjustable amplifier 333 may be fixed.

In some embodiments, the turns ratio of the transformer 331 is corresponding to an attenuation ratio between the test waveform signal 410 and the false track signal 420. That is to say, the signal conversion circuit 330 may not include the signal attenuator 332, but control the attenuation ratio between the test waveform signal 410 and the false track signal 420 through the transformer 331.

Figure 7:
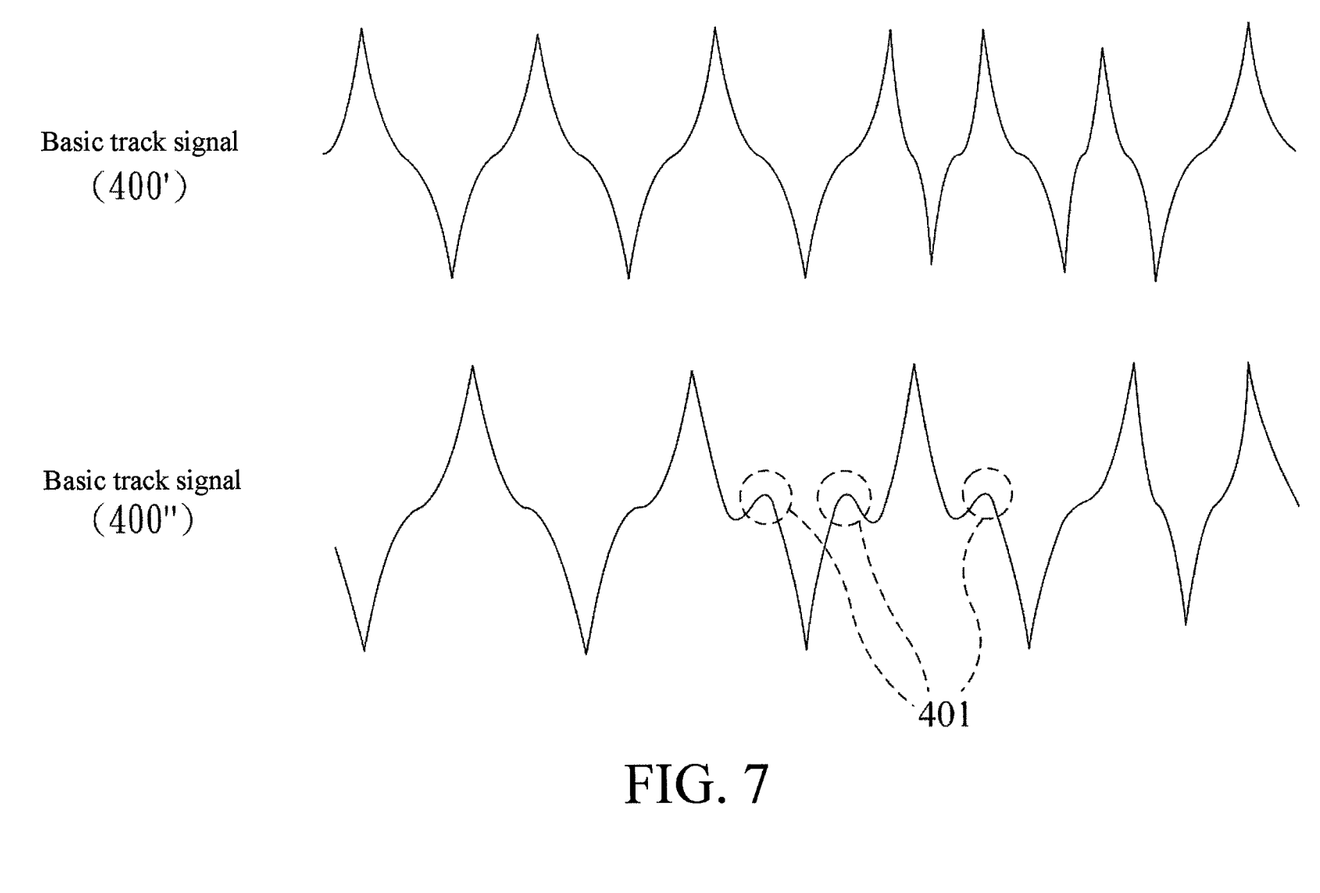
FIG. 7 is a schematic diagram of basic track signals according to another embodiment.

FIG. 7 is a schematic diagram of basic track signals 400', 400" according to another embodiment.

In some embodiments, as shown in FIG. 7, as compared with the basic track signal 400', the basic track signal 400" may further include noise or amplitude jitter 401. Consequently, the tolerance of the magnetic stripe decoder chip 200 on the noise may be tested.

In some embodiments, the test device may, corresponding to the plurality of magnetic stripe decoder chips 200, include a plurality of chip slots 320 and a plurality of signal conversion circuits, so as to test magnification magnetic stripe decoder chips 200 at the same time.

In view of this, the test device for the magnetic stripe decoder chip according to the embodiments may reliably test the magnetic stripe decoder chip in various specific swiping rates, and may avoid manual swiping actions, thereby reducing the test time. Furthermore, by adjusting the amplitude variation of the test waveform signal, tolerance of the magnetic stripe decoder chip on external interference (for example, signal drift), may be tested. Furthermore, through the test waveform signal including amplitude jitter, tolerance of the magnetic stripe decoder chip on noise interference may be tested.

While the disclosure has been described by the way of example and in terms of the preferred embodiments, it is to be understood that the disclosure need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A test device for a magnetic stripe decoder chip, wherein the magnetic stripe decoder chip comprises at least one track signal receiving end, the test device comprising:
   a signal generator, sequentially outputting a plurality of test waveform signals, wherein the test waveform signals are formed by amplifying or reducing a period of a basic track signal generated by a control unit in different magnifications;
   a chip slot physically receiving the magnetic stripe decoder chip;
   a signal conversion circuit, connected electrically between the signal generator and the chip slot, wherein the signal conversion circuit comprises at least one transformer, a primary side of the at least one transformer is connected electrically to the signal generator, a secondary side of the at least one transformer is connected electrically to the chip slot, at least one transformer converts the test waveform signals into a plurality of false track signals and outputs the false track signals to one of the at least one track signal receiving end of the magnetic stripe decoder chip; and
   the control unit, connected electrically to the chip slot, receiving at least one decoding string generated respectively by decoding the false track signals through the magnetic stripe decoder chip, and comparing the at least one decoding string with a test string represented by the basic track signal, the comparing thereby testing the decoding and operational parameters of the magnetic stripe decoder chip without relative motion between a magnetic stripe card and corresponding reader.

2. The test device according to claim 1, wherein the control unit is connected electrically to the signal generator, and transmits the basic track signal to the signal generator in advance.

3. The test device according to claim 1, wherein the signal generator varies, with a gain range, amplitude of at least a part of each of the test waveform signals.

4. The test device according to claim 3, wherein the gain range is 30% to 150%.

5. The test device according to claim 1, wherein the signal conversion circuit further comprises:
   a signal attenuator, connected electrically between the signal generator and the at least one transformer, for attenuating the test waveform signals to be conforming to an input voltage range of the at least one track signal receiving end.

6. The test device according to claim 1, wherein the signal conversion circuit further comprises:
   at least one adjustable amplifier, respectively connected electrically between the signal generator and the primary side of the at least one transformer, for receiving the test waveform signals, and adjusting the gain of the adjustable amplifier according to an amplification control signal output by the control unit.

7. The test device according to claim 6, wherein the at least one adjustable amplifier changes the gains of the test waveform signals over time according to the change of the amplification control signal.

8. The test device according to claim 6, wherein a gain range of the adjustable amplifier is 30% to 150%.

9. The test device according to claim 1, wherein a turns ratio of the at least one transformer is corresponding to an attenuation ratio between the test waveform signals and the false track signals.

* * * * *